US012571087B2

(12) United States Patent
Tse et al.

(10) Patent No.: US 12,571,087 B2
(45) Date of Patent: Mar. 10, 2026

(54) SUBMERGED-PLASMA PROCESS FOR THE PRODUCTION OF NANOSTRUCTURED MATERIALS

(71) Applicant: Rutgers, The State University of New Jersey, New Brunswick, NJ (US)

(72) Inventors: Stephen D. Tse, New Brunswick, NJ (US); Chuiyuan Meng, New Brunswick, NJ (US); Thomas Nosker, New Brunswick, NJ (US); Bernard H. Kear, New Brunswick, NJ (US); Mustafa M. Mozael, New Brunswick, NJ (US)

(73) Assignee: Rutgers, The State University of New Jersey, New Brunswick, NJ (US)

( * ) Notice: Subject to any disclaimer, the term of this patent is extended or adjusted under 35 U.S.C. 154(b) by 643 days.

(21) Appl. No.: 17/932,044

(22) Filed: Sep. 14, 2022

(65) Prior Publication Data

US 2023/0077902 A1 Mar. 16, 2023

Related U.S. Application Data

(60) Provisional application No. 63/244,298, filed on Sep. 15, 2021.

(51) Int. Cl.
| | |
|---|---|
| *C23C 14/32* | (2006.01) |
| *B01J 37/34* | (2006.01) |
| *C23C 14/06* | (2006.01) |
| *C23C 14/08* | (2006.01) |

(52) U.S. Cl.
CPC .......... *C23C 14/325* (2013.01); *B01J 37/341* (2013.01); *B01J 37/349* (2013.01); *C23C 14/0605* (2013.01); *C23C 14/0623* (2013.01); *C23C 14/0647* (2013.01)

(58) Field of Classification Search
CPC .............. C23C 14/325; C23C 14/0605; C23C 14/0623; C23C 14/0647
See application file for complete search history.

(56) References Cited

U.S. PATENT DOCUMENTS 9,394,632 B2    7/2016    Zettl

FOREIGN PATENT DOCUMENTS

AU            685828 B2 *  1/1998  .............. B22F 1/065

OTHER PUBLICATIONS

Nguyen, L.N.; Lamichhane, P.; Choi, E.H.; Lee, G.J. Structural and Optical Sensing Properties of Nonthermal Atmospheric Plasma-Synthesized Polyethylene Glycol-Functionalized Gold Nanoparticles. Nanomaterials 2021, 11, 1678 (Year: 2021).*
Hagino et al., "Ultrahigh-Speed Synthesis of Nanographene Using Alcohol In-Liquid Plasma", Applied Physics Express, 2012, vol. 5, 035101, 3 pages.

(Continued)

*Primary Examiner* — Brian W Cohen
*Assistant Examiner* — Nathanael Jason Downes
(74) *Attorney, Agent, or Firm* — Michael Best & Friedrich LLP

(57) ABSTRACT

Described herein is a submerged-plasma process for the production of amorphous and nanocrystalline nanostructured materials, depending on processing conditions, from precursors that can be in the liquid or injected into the plasma or both.

17 Claims, 6 Drawing Sheets

(56)      References Cited

OTHER PUBLICATIONS

Pristavita et al., "Carbon nano-flakes produced by an inductively coupled thermal plasma system for catalyst applications", Plasma Chem. Plasma Process, 2011, pp. 393-403.

Wang et al., "Structure and photoluminescence properties of graphene nanoflakes grown on zinc oxide films by hot filament chemical vapor deposition", Diamon and Related Materials, vol. 64, pp. 42-48., year: 2016.

Al-Kamal, "Synthesis of Ag-Doped TiO2 nanoparticles by combining laser decomposition of titanium isopropoxide and ablation of Ag for dye-sensitized solar cells", Master Thesis submitted to the Graduate School—New Brunswick Rutgers the State University of New Jersey, 2015, 55 pages.

* cited by examiner

FIG. 3

Raman Mapping(9 points, 40x40μm)

SUBMERGED-PLASMA PROCESS FOR THE PRODUCTION OF NANOSTRUCTURED MATERIALS

CROSS-REFERENCE TO RELATED APPLICATIONS

This application claims priority to U.S. Provisional Patent Application No. 63/244,298, filed on Sep. 15, 2021, which is incorporated by reference herein in its entirety.

FEDERALLY SPONSORED RESEARCH

This invention was made with government support under W911NF-17-1-0111 awarded by the Army Research Office. The government has certain rights in the invention.

TECHNICAL FIELD

Described herein is a submerged-plasma process for the production of amorphous and nanocrystalline nanostructured materials, depending on processing conditions, from liquid precursors.

BACKGROUND

Numerous techniques have been developed for the production of nanoparticles, including laser ablation, microwave plasma synthesis, precipitation from solution, spray pyrolysis, plasma arc synthesis, hydrodynamic cavitation, and gas condensation. With their continuous and high throughput, gas-phase processes are generally employed for the manufacture of commercial quantities of nanoparticles. Nevertheless, conventional aerosol synthesis has had difficulty synthesizing certain materials, such as graphene flakes, or producing amorphous or metastable structures. Precursor decomposition kinetics and flow-field quenching rates play large roles in achieving the above materials and structures. Moreover, problems of agglomeration (the adhesion of particles to each other because of van der Waals forces) remain a limiting factor since aggregated masses of nanoparticles are difficult to cleave into their individual primary particles, thereby defeating the purpose of producing a high surface-area powder. As such, techniques are highly sought for continuously producing high-quality, non-agglomerated nanopowders at large rates of various compositions, morphologies, and microstructures.

Other researchers have rapidly quenched aerosols using critical-flow nozzles to control the size, morphology, and phase composition in the synthesis of nanoparticles. Recent developments in laser ablation in confining liquids present a promising technique to produce ultrafine active nanoparticles with high purity and crystallinity, where the corresponding elements can be introduced into the liquid medium as a target. New techniques, strategically combining key attributes of other methods, could attain collectively multiple synthesis aspects unachievable before. The fabrication of such nanostructured materials offers many exciting opportunities in renewable energy utilization, environmental compliance, and product development. Therefore, a scalable, robust, and economical technology is needed to produce desired nanostructured materials, including oxides and non-oxides (such as carbon nanostructures), in possibly far-from-equilibrium stoichiometries.

SUMMARY

One embodiment described herein is a method for producing a nanostructured material comprising: (a) producing a zone of plasma; (b) submerging at least a portion of the jet of plasma in a quenching liquid; (c) contacting the submerged jet of plasma with a precursor material to form a nanostructured material; (d) injecting a precursor material into the plasma jet upstream of the quenching liquid; and (e) using the fabricated materials as-synthesized or post-annealing to modify the phase or microstructure or morphology. In one aspect, the zone of plasma in step (a) is produced by a high-enthalpy arc-plasma setup or an arc welding torch. In another aspect, the zone of plasma in step (a) is produced by an inductively-coupled plasma setup or an arc welding torch. In another aspect, the zone of high enthalpy in step (a) is produced by a flame, that is electromagnetically or plasma assisted. In another aspect, the quenching liquid comprises the precursor material. In another aspect, the quenching liquid comprises high purity water or other solvent. In another aspect, a portion of the precursor material remains unsubmerged. In another aspect, the precursor material comprises a solid, such as mesh, substrate, or powder. In another aspect, the precursor material comprises a hydrocarbon. In another aspect, the precursor material comprises methane. In another aspect, the precursor material comprises a liquid immediately prior to contacting plasma. In another aspect, the precursor material comprises a gas immediately prior to contacting plasma. In another aspect, the nanostructured material comprises a particle. In another aspect, the nanostructured material comprises a film. In another aspect, the nanostructured material comprises graphene nanoflakes or 2-D nanoflakes comprising h-BN or $MoS_2$. In another aspect, the nanostructured material is amorphous. In another aspect, the method further comprises (f) annealing the amorphous nanostructured material to form an at least partially nanocrystalline material. In another aspect, the nanostructured material is produced at a rate of greater than or on the order of about 1 pound/hour (~0.45 kg/h).

Another embodiment described herein is a nanostructured material produced by the methods described herein.

Another embodiment described herein is a submerged-plasma process for the production of amorphous nanostructured materials by controlled decomposition of liquid precursors, wherein the submerged plasma is generated by a pulsed-laser beam focused just below the surface of the liquid precursor or at a substrate submerged within the liquid precursor. In one aspect, the liquid precursor is a metalorganic precursor comprising titanium tetra-isopropoxide (TTIP), or alkali salts comprising alkali metal nitrates, in an appropriate solvent. In another aspect, the plasma-induced decomposition of the metalorganic or alkali salt precursor, followed by rapid condensation/quenching of vaporized species in the surrounding chilled liquid, yields amorphous nanostructured particles and films. In another aspect, the composition of a representative sample of amorphous material is rich in oxygen and carbon (or other constituent elements) with respect to stoichiometric, e.g., about $TiO_{2.7}C_{1.9}$, relative to $TiO_2$. In another aspect, the post-annealing in air or nitrogen at a relatively low temperature transforms amorphous-$TiO_2$ (or any amorphous phase metal-oxide or non-oxide) into nanocrystalline anatase-$TiO_2$ (or any metastable phase metal-oxide or non-oxide). In another aspect, the approximate low-temperature range is 400 to 800° C. for 2 hr. In another aspect, the post-annealing in air or nitrogen at ~800° C. for 2 hr transforms the nanocrystalline anatase-$TiO_2$ (or any metastable phase metal-oxide or non-oxide) into nanocrystalline rutile-$TiO_2$ (or any equilibrium phase metal-oxide or non-oxide), accompanied by at least partial particle/grain coarsening. In another aspect, the pulsed-laser beam is replaced by a high-enthalpy arc-plasma, inductively-coupled plasma, or tungsten arc plasma torch, which can be just above the surface or partially submerged or completely submerged in the liquid, thus achieving higher nanoparticle production rates at reduced processing costs, along with possible injection of precursor into the plasma upstream of the quenching liquid. In another aspect, nanostructured oxide ceramics are produced by selection of liquid precursors comprising aluminum isopropoxide (or other metalorganics) to generate nanocrystalline $Al_2O_3$ (or other metal oxide nor non-oxide). In another aspect, a two-component or a three-component oxide ceramic is produced by selection of mixed-liquid precursors comprising, e.g., titanium isopropoxide and aluminum isopropoxide to produce $TiO_2$—$Al_2O_3$ nanocomposites, with varying weight fractions of the constituent phases. In another aspect, non-oxide ceramics, e.g., superhard phases comprising diamond and cubic-BN, are produced by liquid precursors, e.g., comprising hexane, to produce nanocrystalline cubic-diamond or borazine to produce nanocrystalline cubic-BN. In another aspect, the process produces nanoparticle agglomerates that are suitable as feedstock materials for flame- or plasma-spraying of protective coatings that are resistant to abrasive, erosive, and corrosive wear and/or to provide high temperature oxidation and hot-corrosion resistance. In another aspect, the process produces nanoparticle aggregates suitable as feedstock materials for pressure-assisted sintering of powder compacts to yield nanoporous or fully dense nanostructured components or parts for diverse applications. In another aspect, the process produces of thin/thick nanostructured films that can be incorporated in laminated structures, e.g., to enhance blast-wave protection and ballistic-impact resistance or for use in devices, such as musical instruments, to adjust impedance mismatch.

Another embodiment described herein is an amorphous nanostructured material produced by the processes described herein.

DESCRIPTION OF THE DRAWINGS

FIG. 2A shows core-shell structures of partially-transformed nanoparticles, in which the shell is transformed (crystalline) anatase-$TiO_2$ and the core is un-transformed amorphous-$TiO_2$. FIG. 2B shows a high-resolution image of a nano-fiber indicating propagation of a phase-transformation interface via a layer-by-layer mechanism, propagating from outside in. Note the expansion of a single, sleeve-like molecular layer in opposite directions.

FIG. 3 shows a schematic of submerged plasma in a distilled water bath producing graphene nanoflakes (GNFs). Methane is the precursor gas (injected into the plasma), and Ar is the plasma and sheath gases.

4

Figure 5A:
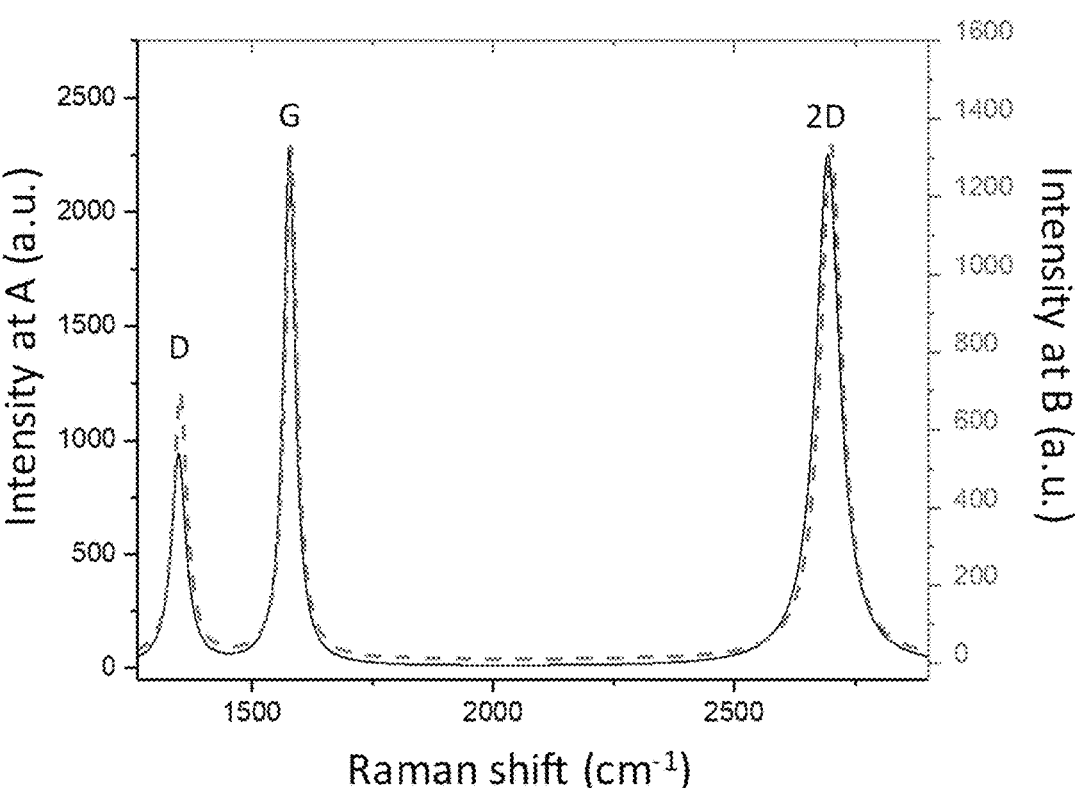
Figure 5B:
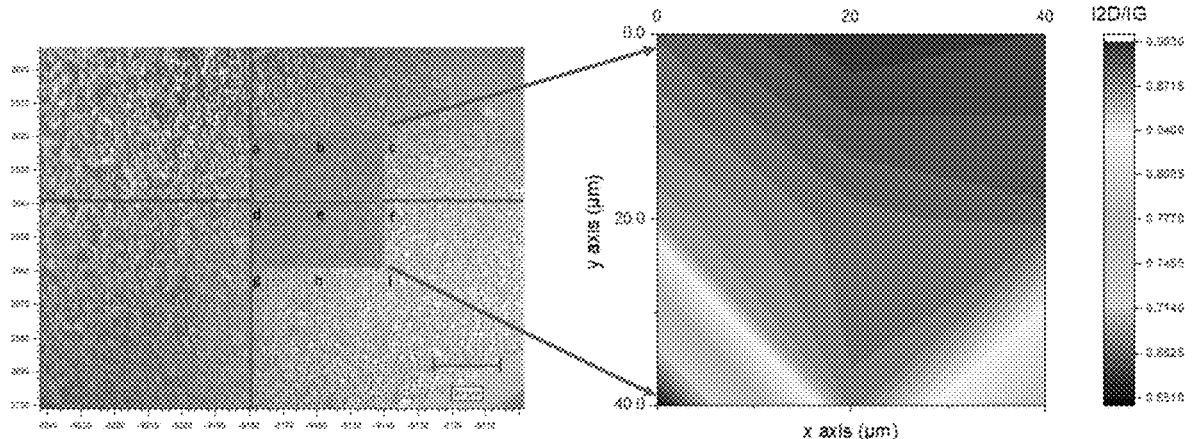

FIG. 5A-B shows the characteristic Raman spectra and Raman mapping of a GNF, respectively. The similarity of the spectra indicates the overall uniformity of each graphene flake, which is composed of about 2 layers.

DETAILED DESCRIPTION

Unless otherwise defined, all technical and scientific terms used herein have the same meaning as commonly understood by one of ordinary skill in the art. For example, any nomenclatures used in connection with, and techniques of chemistry, physics, materials science, and engineering described herein are well known and commonly used in the art. In case of conflict, the present disclosure, including definitions, will control. Exemplary methods and materials are described below, although methods and materials similar or equivalent to those described herein can be used in practice or testing of the embodiments and aspects described herein.

As used herein, the terms such as "include," "including," "contain," "containing," "having," and the like mean "comprising." The present disclosure also contemplates other embodiments "comprising," "consisting of," and "consisting essentially of," the embodiments or elements presented herein, whether explicitly set forth or not.

As used herein, the term "a," "an," "the" and similar terms used in the context of the disclosure (especially in the context of the claims) are to be construed to cover both the singular and plural unless otherwise indicated herein or clearly contradicted by the context. In addition, "a," "an," or "the" means "one or more" unless otherwise specified.

As used herein, the term "or" can be conjunctive or disjunctive.

As used herein, the term "substantially" means to a great or significant extent, but not completely.

As used herein, the term "about" or "approximately" as applied to one or more values of interest, refers to a value that is similar to a stated reference value, or within an acceptable error range for the particular value as determined by one of ordinary skill in the art, which will depend in part on how the value is measured or determined, such as the limitations of the measurement system. In one aspect, the term "about" refers to any values, including both integers and fractional components that are within a variation of up to ±10% of the value modified by the term "about." Alternatively, "about" can mean within 3 or more standard deviations, per the practice in the art. Alternatively, such as with respect to biological systems or processes, the term "about" can mean within an order of magnitude, in some embodiments within 5-fold, and in some embodiments within 2-fold, of a value. As used herein, the symbol "~" means "about" or "approximately."

All ranges disclosed herein include both end points as discrete values as well as all integers and fractions specified within the range. For example, a range of 0.1-2.0 includes 0.1, 0.2, 0.3, 0.4 . . . 2.0. If the end points are modified by the term "about," the range specified is expanded by a variation of up to ±10% of any value within the range or within 3 or more standard deviations, including the end points.

For purposes of this disclosure, the chemical elements are identified in accordance with the Periodic Table of the Elements (CAS version) and the *Handbook of Chemistry and Physics* (98$^{th}$ Edition).

Described herein is a submerged-plasma process for the production of amorphous and nanocrystalline nanostructured materials in a quenching liquid, depending on processing conditions. The quenching liquid can be composed of liquid precursors and solvent. Solid precursors, e.g., metal substrate on which the plasma contacts, can be in the quenching liquid. Solid, liquid, or gaseous precursors can be in contact with the plasma prior to its interaction with the quenching liquid.

In one embodiment described herein, mainly for demonstration of feasibility of the process, a pulsed-laser beam is focused just below the surface of the liquid precursor to generate a submerged-plasma region, where rapid precursor decomposition and vaporization occurs accompanied by rapid quenching of vaporized species by the surrounding chilled liquid to yield amorphous nanostructured particles and films. For example, by using a pulsed laser operating in a controlled environment, nanoparticles are formed within the liquid precursor itself. Nanostructured films are also formed on the walls of the reactor chamber, apparently by a vapor transport and condensation mechanism. In another embodiment of the invention, a high-enthalpy arc-plasma or inductively-coupled plasma is used to create the submerged-plasma, with advantages that production rates are increased to industrial scale, processing costs are significantly reduced compared to a pulsed laser setup for commercial viability, and augmentation of materials compositions attainable given that precursors can also be seeded into the plasma itself in gaseous, liquid, or solid form.

Given the high quenching rates that the surrounding liquid can offer, along with moving particles out of the hot zones and keeping them in suspension, amorphous materials can be created. Post-fabrication annealing at relatively low temperatures can then transform the amorphous materials into nanocrystalline states. An example highlighted in this disclosure involves pulsed-laser decomposition of liquid titanium tetraisopropoxide (TTIP) to generate nanostructured particles and films of amorphous-$TiO_2$, which upon post annealing at about 400° C. transform into nanocrystalline anatase-$TiO_2$. Upon post-annealing at about 800° C., nanocrystalline anatase-$TiO_2$ transforms into nanocrystalline rutile-$TiO_2$. A similar behavior is expected for other liquid precursors, for example, using aluminum isopropoxide to yield amorphous and nanocrystalline $Al_2O_3$. In principle, this new process may also be used to synthesize non-oxide ceramics and superhard materials. Additionally, a substrate of a given material can be placed within the liquid precursor solution, at which the laser is directed and focused, allowing for doping of the formed nanoparticles with the substrate material or mixed/composite formation.

In another aspect, a submerged-plasma process is disclosed for the production of graphene nanoflakes (GNFs) utilizing gaseous or liquid hydrocarbons as feed materials. An attractive precursor is methane ($CH_4$) since it is widely available and inexpensive in the form of natural gas.

In another embodiment, methane gas is fed into an inductively-coupled plasma, whose plume is directed into and submerged, partially or in its entirety, in a bath of high purity water (e.g., distilled water) or other solvent, where rapid precursor decomposition-vaporization occurs within the plasma prior to rapid condensation-quenching of vaporized species in the surrounding chilled water or solvent, forming graphene nanoflakes (GNFs). In another embodiment of the invention, methane gas is fed into a high-enthalpy tungsten-arc plasma to obtain a similar product, but at a higher production rate and at a reduced processing cost. Various types of tungsten-arc plasma torches are available commercially, all of which can be used for this purpose. In the present disclosure, several arc-plasma torches, all immersed in a large bath of vigorously stirred and chilled high purity water, were fed with methane gas to realize a high production rate of GNFs.

Many variations of this basic process can be used to generate various carbon-based products, including fullerenes, carbon nanotubes, and diamond-like nanoparticles. Moreover, the same process may be used for doping carbon with other elements (e.g., B, N, Si, Ti). Since underwater tungsten-arc welding has been used in the ship-repair industry, another possibility is to direct the high-enthalpy plasma onto a metal substrate to generate metal nanoparticles.

This same process, with minor modifications, can be applied to many different materials systems. For example, liquid hexamethyldisilazane (HMDS) may be used as precursor to synthesize SiC, $Si_3N_4$, or $SiC_xN_y$ nanoparticles. Here, an adjustment in the composition of the precursor and its carrier gas is necessary, for example, using $N_2$ as a carrier gas for HMDS. The presence of so much $N_2$ in the plasma should shift the composition of the resulting nanostructured product to $Si_3N_4$. Similarly, using $CH_4$ as a carrier gas for HMDS should shift the composition to SiC. By the same reasoning, carrier gas mixtures of $N_2$ and $CH_4$ should give nanostructured products with $SiC_xN_y$ compositions.

An example method is described herein for synthesizing amorphous $TiO_2$ nanoparticles by directing a laser- or arc-induced plasma into a bath of chilled liquid titanium tetraisopropoxide (TTIP). A hybrid system that integrates the two processes into one operating system offers certain distinct advantages. For example, a hybrid system in which a carbon-enriched plasma plume is directed into liquid-TTIP precursor may yield TiC nanoparticles via a favorable reduction mechanism. Other metal carbides, nitrides, sulfides, etc. could conceivably be produced in a similar manner. Many other possibilities for synthesizing nanostructured particles and films can be envisioned, which illustrates the versatility of the methods described herein.

One embodiment described herein is a method comprising: (a) producing a zone of plasma; (b) submerging at least a portion of the jet of plasma in a quenching liquid; and (c) contacting the submerged jet of plasma with a precursor material to form a nanostructured material. In one aspect, the zone of plasma in step (a) is produced by a high-enthalpy arc-plasma setup or an arc welding torch. In another aspect, the zone of plasma in step (a) is produced by an inductively-coupled plasma setup. In another aspect, the quenching liquid comprises the precursor material. In another aspect, the quenching liquid comprises high purity water. In another aspect, a portion of the precursor material remains unsubmerged. In another aspect, the precursor material comprises a hydrocarbon. In another aspect, the precursor material comprises methane. In another aspect, the precursor material comprises a liquid immediately prior to contacting plasma. In another aspect, the precursor material comprises a gas immediately prior to contacting plasma. In another aspect, the nanostructured material comprises a particle. In another aspect, the nanostructured material comprises a film. In another aspect, the nanostructured material comprises graphene nanoflakes. In another aspect, the nanostructured material is amorphous. In another aspect, the method further comprises (d) annealing the amorphous nanostructured material to form an at least partially nanocrystalline material. In another aspect, the nanostructured material is produced at a rate of greater than or equal to about 1 pound/hour.

Another embodiment is that the high-enthalpy source is a flame jet or an arc welding torch.

Another embodiment described herein is a nanostructured material produced by the methods described herein.

One embodiment described herein is a method for producing a nanostructured material comprising: (a) producing a zone of plasma; (b) submerging at least a portion of the jet of plasma in a quenching liquid; (c) contacting the submerged jet of plasma with a precursor material to form a nanostructured material; (d) injecting a precursor material into the plasma jet upstream of the quenching liquid; and (e) using the fabricated materials as synthesized or post annealing to modify the phase or microstructure or morphology. In one aspect, the zone of plasma in step (a) is produced by a high-enthalpy arc-plasma setup or an arc welding torch. In another aspect, the zone of plasma in step (a) is produced by an inductively-coupled plasma setup. In another aspect, the zone of high enthalpy in step (a) is produced by a flame, that is electromagnetically or plasma assisted. In another aspect, the quenching liquid comprises the precursor material. In another aspect, the quenching liquid comprises high purity water or other solvent. In another aspect, a portion of the precursor material remains unsubmerged. In another aspect, the precursor material comprises a solid, such as mesh, substrate, or powder. In another aspect, the precursor material comprises a hydrocarbon. In another aspect, the precursor material comprises methane. In another aspect, the precursor material comprises a liquid immediately prior to contacting plasma. In another aspect, the precursor material comprises a gas immediately prior to contacting plasma. In another aspect, the nanostructured material comprises a particle. In another aspect, the nanostructured material comprises a film. In another aspect, the nanostructured material comprises graphene nanoflakes or 2-D nanoflakes, such as h-BN or $MoS_2$. In another aspect, the nanostructured material is amorphous. In another aspect, the method further comprises (f) annealing the amorphous nanostructured material to form an at least partially nanocrystalline material. In another aspect, the nanostructured material is produced at a rate of greater than or on the order of about 1 pound/hour (~0.45 kg/h).

Another embodiment described herein is a nanostructured material produced by the methods described herein.

Another embodiment described herein is a submerged-plasma process for the production of amorphous nanostructured materials by controlled decomposition of liquid precursors, wherein the submerged plasma is generated by a pulsed-laser beam focused just below the surface of the liquid precursor or at a substrate submerged within the liquid precursor. In one aspect, the liquid precursor is a metalorganic precursor comprising titanium tetra-isopropoxide (TTIP), or alkali salts comprising alkali metal nitrates, in an appropriate solvent. In another aspect, the plasma-induced decomposition of the metalorganic or alkali salt precursor, followed by rapid condensation/quenching of vaporized species in the surrounding chilled liquid, yields amorphous nanostructured particles and films. In another aspect, the composition of a representative sample of amorphous material is rich in oxygen and carbon (or other constituent elements) with respect to stoichiometric, e.g., about $TiO_{2.7}C_{1.9}$, relative to $TiO_2$. In another aspect, the post-annealing in air or nitrogen at a relatively low temperature transforms amorphous-$TiO_2$ (or any amorphous phase metal-oxide or non-oxide) into nanocrystalline anatase-$TiO_2$ (or any metastable phase metal-oxide or non-oxide). In another aspect, the approximate low-temperature range is 400 to 800° C., including all integers and endpoints within the range, for 2 hr. In another aspect, the post-annealing in air or nitrogen at ~800° C. for 2 hr transforms the nanocrystalline anatase-$TiO_2$ (or any metastable phase metal-oxide or non-oxide) into nanocrystalline rutile-$TiO_2$ (or any equilibrium phase metal-oxide or non-oxide), accompanied by at least partial particle/grain coarsening. In another aspect, the pulsed-laser beam is replaced by a high-enthalpy arc-plasma or inductively-coupled plasma, which can be just above the surface or partially submerged or completely submerged in the liquid, thus achieving higher nanoparticle production rates at reduced processing costs, along with possible injection of precursor into the plasma upstream of the quenching liquid. In another aspect, nanostructured oxide ceramics are produced by selection of liquid precursors comprising aluminum isopropoxide (or other metalorganics) to generate nanocrystalline $Al_2O_3$ (or other metal oxide nor non-oxide). In another aspect, a two-component or a three-component oxide ceramic is produced by selection of mixed-liquid precursors comprising, e.g., titanium isopropoxide and aluminum isopropoxide to produce $TiO_2$—$Al_2O_3$ nanocomposites, with varying weight fractions of the constituent phases. In another aspect, non-oxide ceramics, e.g., superhard phases comprising diamond and cubic-BN, are produced by liquid precursors, e.g., comprising hexane, to produce nanocrystalline cubic-diamond or borazine to produce nanocrystalline cubic-BN. In another aspect, the process produces nanoparticle agglomerates that are suitable as feedstock materials for flame- or plasma-spraying of protective coatings that are resistant to abrasive, erosive, and corrosive wear and/or to provide high temperature oxidation and hot-corrosion resistance. In another aspect, the process produces nanoparticle aggregates suitable as feedstock materials for pressure-assisted sintering of powder compacts to yield nanoporous or fully dense nanostructured components or parts for diverse applications. In another aspect, the process produces of thin/thick nanostructured films that can be incorporated in laminated structures, e.g., to enhance blast-wave protection and ballistic-impact resistance or for use in devices, such as musical instruments, to adjust impedance mismatch.

Another embodiment described herein is an amorphous nanostructured material produced by the processes described herein.

It will be apparent to one of ordinary skill in the relevant art that suitable modifications and adaptations to the compositions, formulations, methods, processes, and applications described herein can be made without departing from the scope of any embodiments or aspects thereof. The compositions and methods provided are exemplary and are not intended to limit the scope of any of the specified embodiments. All of the various embodiments, aspects, and options disclosed herein can be combined in any variations or iterations. The scope of the compositions, formulations, methods, and processes described herein include all actual or potential combinations of embodiments, aspects, options, examples, and preferences herein described. The exemplary compositions and formulations described herein may omit any component, substitute any component disclosed herein, or include any component disclosed elsewhere herein. The ratios of the mass of any component of any of the compositions or formulations disclosed herein to the mass of any other component in the formulation or to the total mass of the other components in the formulation are hereby disclosed as if they were expressly disclosed. Should the meaning of any terms in any of the patents or publications incorporated by reference conflict with the meaning of the terms used in this disclosure, the meanings of the terms or phrases in this disclosure are controlling. Furthermore, the foregoing discussion discloses and describes merely exemplary embodiments. All patents and publications cited herein are incorporated by reference herein for the specific teachings thereof.

Various embodiments and aspects of the inventions described herein are summarized by the following clauses:

Clause 1. A method for producing a nanostructured material comprising:

(a) producing a zone of plasma;

(b) submerging at least a portion of the jet of plasma in a quenching liquid;

(c) contacting the submerged jet of plasma with a precursor material to form a nanostructured material; and (d) injecting a precursor material into the plasma jet upstream of the quenching liquid (e) using the fabricated materials as synthesized or post annealing to modify the phase or microstructure or morphology.

Clause 2. The method of clause 1, wherein the zone of plasma in step (a) is produced by a high-enthalpy arc-plasma setup or an arc welding torch.

Clause 3. The method of clause 1 or 2, wherein the zone of plasma in step (a) is produced by an inductively-coupled plasma setup.

Clause 4. The method of any one of clauses 1-3, wherein the zone of high enthalpy in step (a) is produced by a flame that is electromagnetically or plasma assisted.

Clause 5. The method any one of clauses 1-4, wherein the quenching liquid comprises the precursor material.

Clause 6. The method any one of clauses 1-5, wherein the quenching liquid comprises high purity water or other solvent.

Clause 7. The method any one of clauses 1-6, wherein a portion of the precursor material remains unsubmerged.

Clause 8. The method any one of clauses 1-7, wherein the precursor material comprises a hydrocarbon, including methane.

Clause 9. The method any one of clauses 1-8, wherein the precursor material comprises a solid in the submerged liquid.

Clause 10. The method any one of clauses 1-9, wherein the precursor material comprises a liquid immediately prior to contacting plasma or contacting the plasma.

Clause 11. The method any one of clauses 1-10, wherein the precursor material comprises a gas immediately prior to contacting plasma or contacting the plasma.

Clause 12. The method any one of clauses 1-11, wherein the nanostructured material comprises a particle.

Clause 13. The method any one of clauses 1-12, wherein the nanostructured material comprises a film.

Clause 14. The method any one of clauses 1-13, wherein the nanostructured material comprises graphene nanoflakes or 2-D nanoflakes comprising h-BN or $MoS_2$.

Clause 15. The method any one of clauses 1-14, wherein the nanostructured material is amorphous.

Clause 16. The method any one of clauses 1-15, further comprising (f) annealing the amorphous nanostructured material to form an at least partially nanocrystalline material.

Clause 17. The method any one of clauses 1-16, wherein the nanostructured material is produced at a rate of greater than or on the order of about 1 pound/hour (~0.45 kg/h).

Clause 18. A nanostructured material produced by the method any one of clauses 1-17.

Clause 19. A submerged-plasma process for the production of amorphous nanostructured materials by controlled decomposition of liquid precursors, wherein the submerged plasma is generated by a pulsed-laser beam focused just below the surface of the liquid precursor or at a substrate submerged within the liquid precursor.

Clause 20. The process of clause 19, wherein the liquid precursor is a metalorganic precursor, comprising titanium tetra-isopropoxide (TTIP), or alkali salts comprising alkali metal nitrates.

Clause 21. The process of clause 19 or 20, wherein the plasma-induced decomposition of the metalorganic or alkali salt precursor, followed by rapid condensation/quenching of vaporized species in the surrounding chilled liquid, yields amorphous nanostructured particles and films.

Clause 22. The process of any one of clauses 19-21, wherein the composition of a representative sample of amorphous material is rich in oxygen and carbon (or other constituent elements) with respect to stoichiometric, e.g., about $TiO_{2.7}C_{1.9}$, relative to $TiO_2$.

Clause 23. The process of any one of clauses 19-22, wherein the post-annealing in air or nitrogen at a relatively low temperature transforms amorphous-$TiO_2$ (or any amorphous phase metal-oxide or non-oxide) into nanocrystalline anatase-$TiO_2$ (or any metastable phase metal-oxide or non-oxide).

Clause 24. The process of any one of clauses 19-23, wherein the low temperature range is 400 to 800° C. for 2 hr.

Clause 25. The process of any one of clauses 19-24, wherein the post-annealing in air or nitrogen at ~800° C. for 2 hr transforms the nanocrystalline anatase-$TiO_2$ (or any metastable phase metal-oxide or non-oxide) into nanocrystalline rutile-$TiO_2$ (or any equilibrium phase metal-oxide or non-oxide), accompanied by at least partial particle/grain coarsening.

Clause 26. The process of any one of clauses 19-25, wherein the pulsed-laser beam is replaced by a high-enthalpy arc-plasma or inductively-coupled plasma, thus achieving higher nanoparticle production rates at reduced processing costs, along with possible injection of precursor into the plasma upstream of the quenching liquid.

Clause 27. The process of any one of clauses 19-26, wherein nanostructured oxide ceramics are produced by selection of liquid precursors comprising aluminum isopropoxide to generate nanocrystalline $Al_2O_3$.

Clause 28. The process of any one of clauses 19-27, wherein a two-component or a three-component oxide ceramic is produced by selection of mixed-liquid precursors comprising, titanium isopropoxide and aluminum isopropoxide to produce $TiO_2$—$Al_2O_3$ nanocomposites, with varying weight fractions of the constituent phases.

Clause 29. The process of clause 19, wherein superhard non-oxide ceramics comprising diamond and cubic-BN, are produced by liquid precursors comprising hexane to produce nanocrystalline cubic-diamond or borazine to produce nanocrystalline cubic-BN.

Clause 30. The process of any one of clauses 19-29, wherein the process produces nanoparticle agglomerates that are suitable as feedstock materials for flame- or plasma-spraying of protective coatings that are resistant to abrasive, erosive, and corrosive wear and/or to provide high temperature oxidation and hot-corrosion resistance.

Clause 31. The process of any one of clauses 19-30, wherein the process produces nanoparticle aggregates suitable as feedstock materials for pressure-assisted sintering of powder compacts to yield nanoporous or fully dense nanostructured components or parts for diverse applications.

Clause 32. The process of any one of clauses 19-31, wherein the process produces of thin/thick nanostructured films that can be incorporated in laminated structures to enhance blast-wave protection and ballistic-impact resistance or for use in musical instruments to adjust impedance mismatch.

Clause 33. An amorphous nanostructured material produced by the processes of any one of clauses 19-32.

EXAMPLES

Example 1

Pulse-Laser Processing

Figure 1:
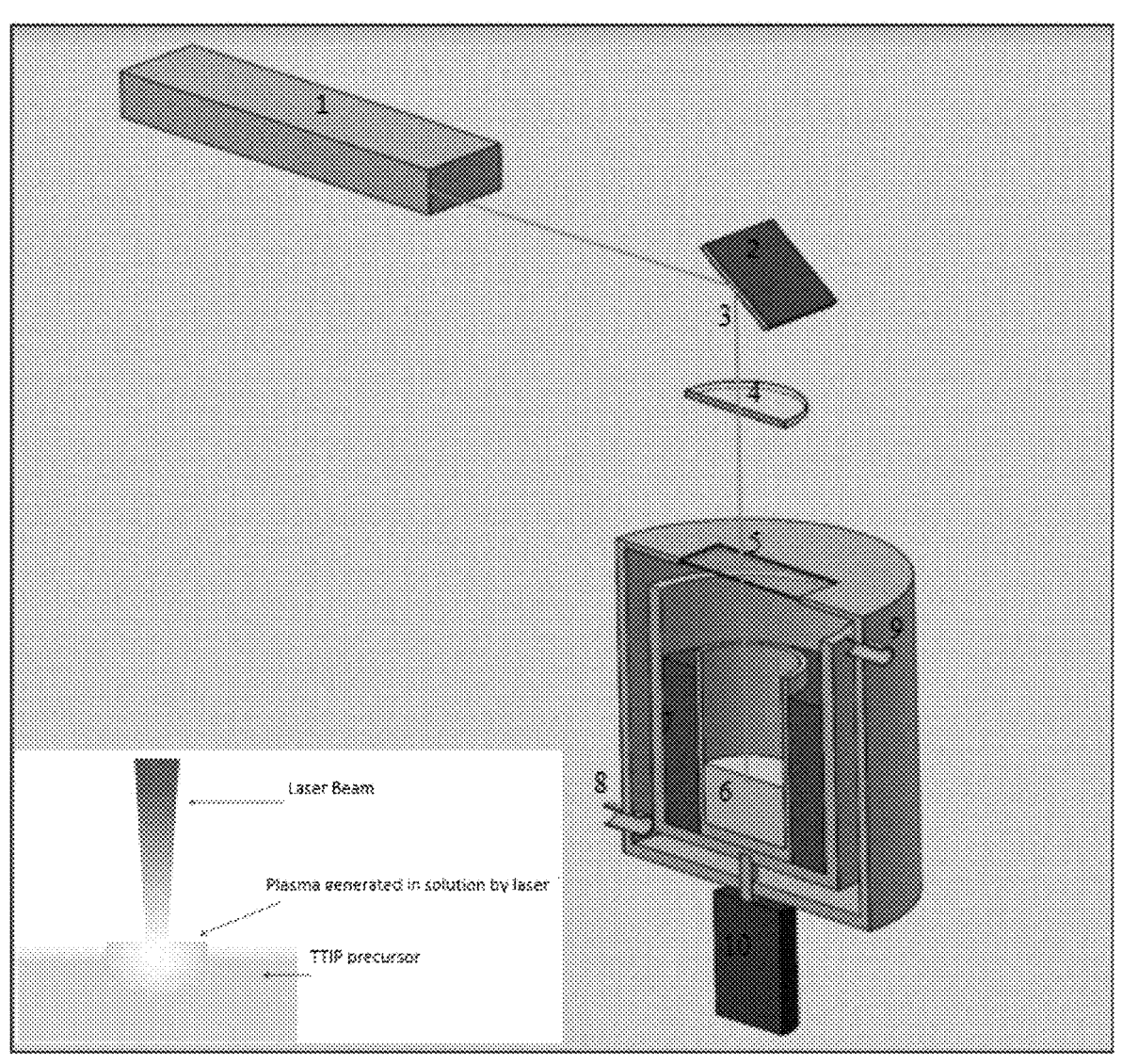
FIG. 1 shows a schematic diagram of an exemplary experimental setup, which is presented to show the feasibility of submerged plasma synthesis of nanomaterials at the lab scale: (1) Nd-YAG laser; (2) reflecting mirror; (3) laser beam; (4) focusing lens; (5) cover plate; (6) liquid titanium tetraisopropoxide (TTIP) precursor; (7) chilled water bath; (8) $N_2$ gas inlet; (9) $N_2$ gas outlet; and (10) motor-driven support.

Pulsed-laser processing of nanostructured amorphous-$TiO_2$ particles and films is presented herein. A schematic of an exemplary experimental arrangement is shown in FIG. 1.

Liquid titanium tetra-isopropoxide (TTIP) precursor partially fills an inner-glass container that is supported on a rotating platform and water cooled. An outer-glass container allows circulation of $N_2$ gas through the system to prevent hydrolysis of the liquid precursor. In practice, an Nd:YAG pulsed laser is focused just below the surface of the liquid precursor to generate a plasma that causes rapid decomposition and vaporization of a small sample of liquid precursor. Since this occurs within the un-reacted and chilled liquid precursor, rapid condensation and quenching of the plasma-vaporized species occurs. Thus, loosely-agglomerated amorphous nanoparticles are formed within the liquid precursor, whereas relatively-dense amorphous films are formed on the cover plate of the reactor vessel not in contact with the liquid precursor. Relatively large-area flakes of aggregated nanoparticles are formed on the side walls of the reactor vessel, near the surface of the liquid precursor.

Since only a small volume (e.g., about 100 mL) of liquid TTIP precursor is used in a typical laboratory experiment, after nucleation of tiny crystallites in the liquid phase, further growth occurs by accretion of newly-condensed species and by coalescence of crystallites, forming nanostructured particles with various morphologies, all with amorphous structures. Spherical nanoparticles, in both agglomerated and aggregated forms, are the most common products of this growth mechanism. Also synthesized are a much smaller fraction of high-aspect ratio nanofibers. In all cases, as-synthesized nanostructured materials are featureless, as would be expected for amorphous structures. This result is in striking contrast to the same materials after post-annealing, where a nano-grain structure is observed within each nanostructured particle, whatever its morphology, as discussed below.

The plasma generator is not limited to a focused laser beam (pulsed or continuous) but may also be a DC-arc or RF-inductively-coupled system. From a practical viewpoint, a high-enthalpy arc-plasma torch appears to be preferable for this purpose. In this case, the plasma plume is directed into a very large bath of precursor liquid, vigorously stirred, to generate copious amounts of nanoparticles within the liquid. Nanoparticles may be separated from the remaining liquid precursor by centrifuging. The technology may be extended to high-enthalpy flames or rapidly reacting phases that experience high exothermicity, or weak flames that are supported by electromagnetic or plasma assistance. The same process, with some modifications, may also be used to synthesize nanostructured non-oxide ceramics (e.g., SiC and TiN), and superhard materials (e.g., diamond and cubic-BN).

Since underwater tungsten-arc welding has been used in the ship-repair industry, directing the high-enthalpy plasma of flame onto a metal substrate (or other solid material) to generate metal nanoparticles (or other composition nanoparticles) should be readily feasible and scalable. In the welding example, the particle products were considered to be waste and not valuable in their own right, so optimization of the process for such nanomaterial synthesis was not investigated. Such particles can be optimized using the methods described herein to produce kilogram quantities of nanostructured particles and films.

Example 2

Material Characteristics

The composition of a representative sample of as-synthesized amorphous material, as measured by XPS, is $TiO_{2.7}C_{1.9}$, which is rich in oxygen and carbon relative to $TiO_2$. The chemical formula of the TTIP precursor is $TiO_4C_{12}H_{28}$. Hence, during plasma synthesis, most of the carbon, oxygen, and hydrogen in the precursor must escape from the system. Further work may reveal the precise nature of the gasified species and their concentrations.

Nanostructured particles and films collected from all locations in the reactor vessel have amorphous or ultra-fine nanocrystalline structures. It is proposed that amorphization of nanoparticles is a consequence of rapid condensation/ quenching of precursor species from the plasma state, where the composition is far from the stoichiometric value required to form $TiO_2$. In other words, it is the presence of excess oxygen and carbon (and possibly hydrogen) in the plasma that inhibits nano-crystallization during rapid quenching. A similar effect should occur in other materials systems, where plasma-vaporized species derived from liquid precursors are far from stoichiometric values.

Post-fabrication annealing can be used to transform the amorphous material into the nanocrystalline state. Tests have shown that the transformation occurs in reasonable times upon post-annealing at about 400° C., forming nanocrystalline anatase-$TiO_2$. Since diffusion distances are small in nanoparticles, whatever their morphologies, it is not surprising that the amorphous-to-nanocrystalline transformation occurs at the relatively low melting temperature of 400° C. (about 0.3 $T_M$). Upon post-annealing at temperatures of about 800° C., nanocrystalline anatase-$TiO_2$ transforms into rutile-$TiO_2$.

Figure 2A:
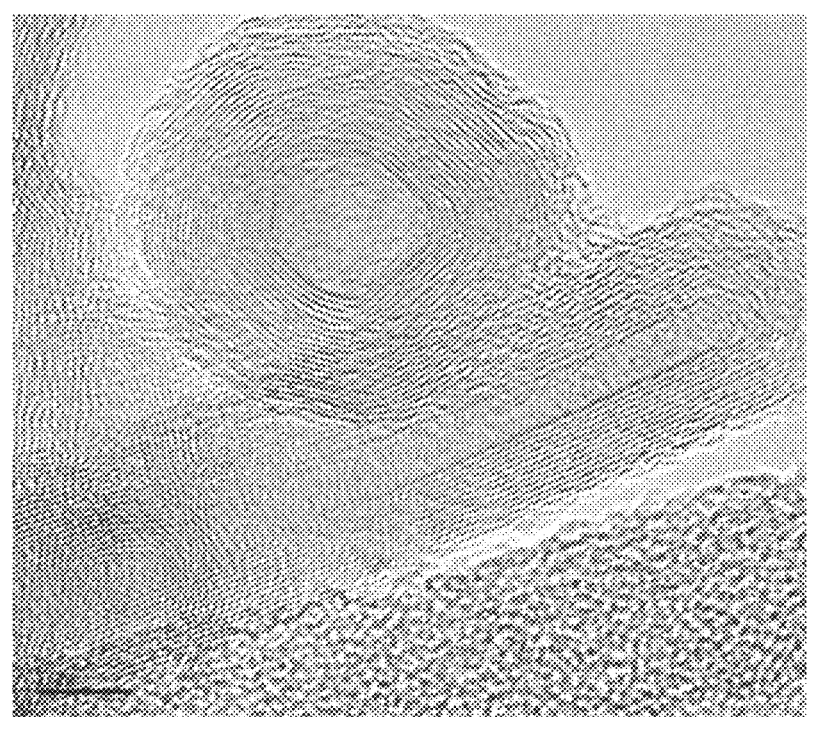
FIG. 2A-B show lattice images of $TiO_2$ nanoparticles after annealing at 400° C. for 2 hours
Figure 2B:
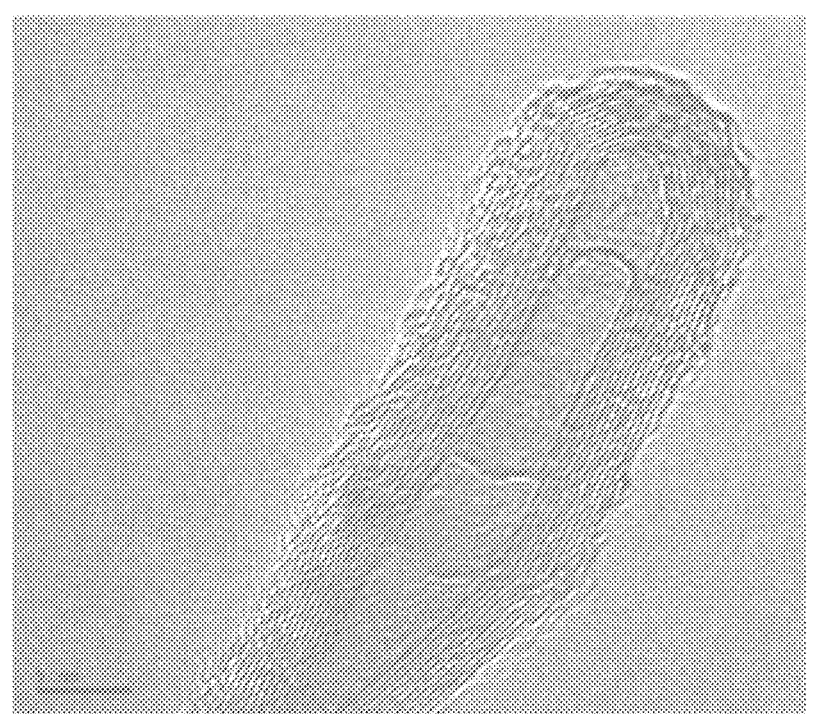

After post-annealing at 400° C. for 2 hours, in air or nitrogen, many examples were observed of partially-transformed anatase-$TiO_2$ particles (FIG. 2). Lattice imaging of a partially-transformed nanoparticle with a spherical morphology (FIG. 2A) shows a core-shell structure, in which the shell is transformed nanocrystalline anatase-$TiO_2$ and the core is un-transformed amorphous-$TiO_2$. A feature of the nanocrystalline core-shell structure is its radially-symmetric pie-shaped morphology. The presence of a high density of edge dislocations at each interface between adjacent nanograins would account for the observed tilt-angle between them. FIG. 2 also shows a similar core-shell structure for a high-aspect ratio nano-fiber (FIG. 2B). In addition, an elongated nanoparticle appears to be composed of an ultra-fine nanocrystalline structure, indicative of homogeneous nucleation throughout the particle during rapid quenching from the plasma state. In other words, both truly amorphous nanoparticles and ultra-fine nanocrystalline particles are observed in the as-synthesized material, which can be rationalized in terms of differences in compositions and quenching rates.

As noted above, the appearance of amorphous structures in as-synthesized nanostructured particles and films is believed to be due to inhibition of nano-crystallization by the presence of excess oxygen, carbon, and hydrogen trapped in the rapidly quenched material. During post-annealing, in-situ reaction of trapped-in species may yield gaseous products (e.g., CO, $CH_4$, $H_2O$) that diffuse out of the particles, leaving sufficient Ti and O to enable crystal-lization of anatase-$TiO_2$. Further analysis of heat-treated samples may provide a more thorough understanding of the mechanism and kinetics involved.

In all cases of partially-transformed nanoparticles, includ-ing nano-onions and nano-fibers, nano-crystallization induced by post-annealing is initiated at the surfaces of the nanoparticles and then propagates uniformly into their inte-riors, eventually yielding fully transformed nanocrystalline anatase-$TiO_2$. In one remarkable case (FIG. 2B), a high-aspect ratio nanofiber shows evidence that the phase trans-formation from amorphous-to-nanocrystalline anatase $TiO_2$ occurs by a layer-by-layer growth mechanism. Moreover, it appears that layered growth starts at a favorable location on the outside and then propagates inward in a sleeve-like manner in opposite directions. Superposition of such sleeve-like layers gradually builds up a radially-symmetric layered nanostructure, reminiscent of a tree's ring-like structure, but from outside in.

Process Applicability

Submerged-plasma processing of liquid precursors to produce amorphous nanostructured oxides appears to be widely applicable. For example, to synthesize amorphous $Al_2O_3$ nanoparticles and films, a suitable liquid precursor would be aluminum isopropoxide. On the other hand, to synthesize amorphous nanostructured SiC or $Si_3N_4$ phases, hexamethyldisilazane (HMDS) may be a good choice. Sub-merged-plasma processing of superhard diamond and cubic-BN phases may also be possible, utilizing liquid hexane as precursor for diamond and liquid borazine as precursor for cubic-BN.

High-Rate Production of Graphene Nanoflakes

Figure 3:
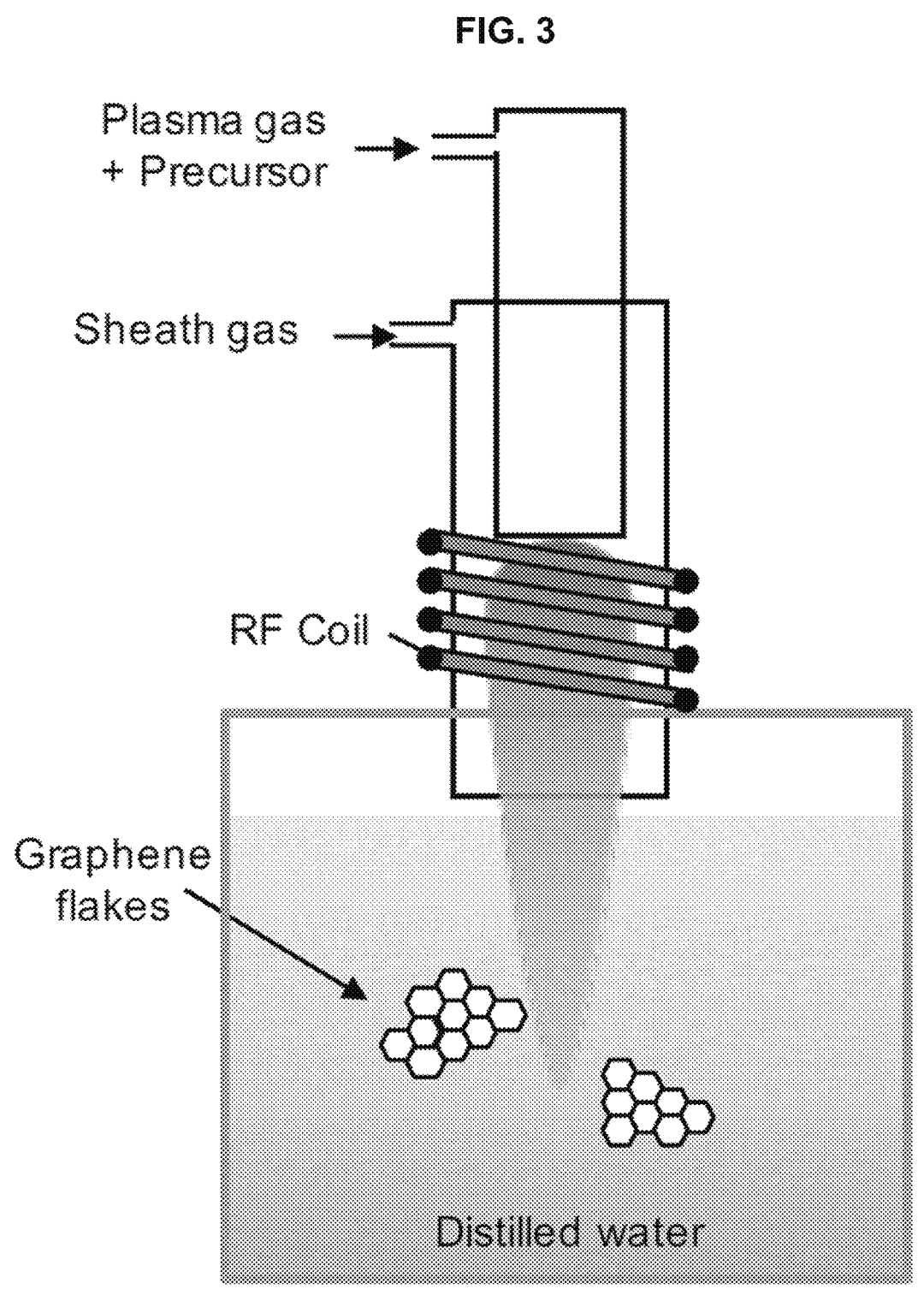

FIG. 3 shows a schematic of a laboratory-scale apparatus (which is scalable) that utilizes a methane-as-precursor fed RF inductively-coupled (Ar) plasma jet directed into a distilled-water bath to produce GNFs, and other nanostruc-tured carbon-base products. As indicated, a feature of the apparatus is a platform that lowers the plasma torch, with its ignited plasma, into high purity water to form a submerged plasma plume. When methane gas is added to the plasma-gas stream, rapid and efficient methane decomposition occurs accompanied by rapid quenching of vaporized spe-cies in the surrounding chilled water, thus generating GNFs. Since the water temperature near the plasma plume is at or near its boiling point, a plethora of tiny steam bubbles are formed, which may provide favorable sites for nucleation and growth of GNFs via a vapor-condensation mechanism.

Figure 4A:
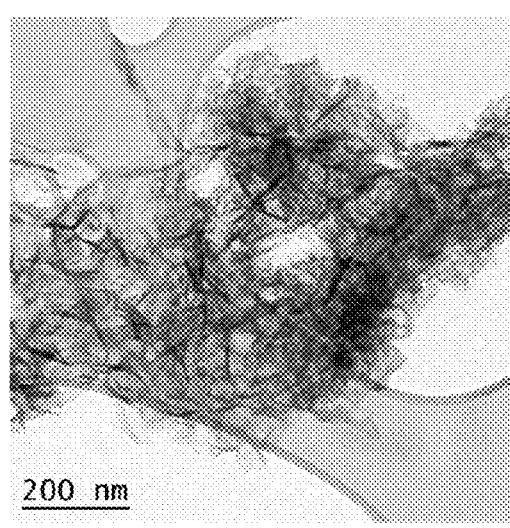
FIG. 4A-B show transmission electron microscopy (TEM) images of GNFs (FIG. 4A) and a selected area electron diffraction (SAED) pattern of the graphene (FIG. 4B).
Figure 4A:
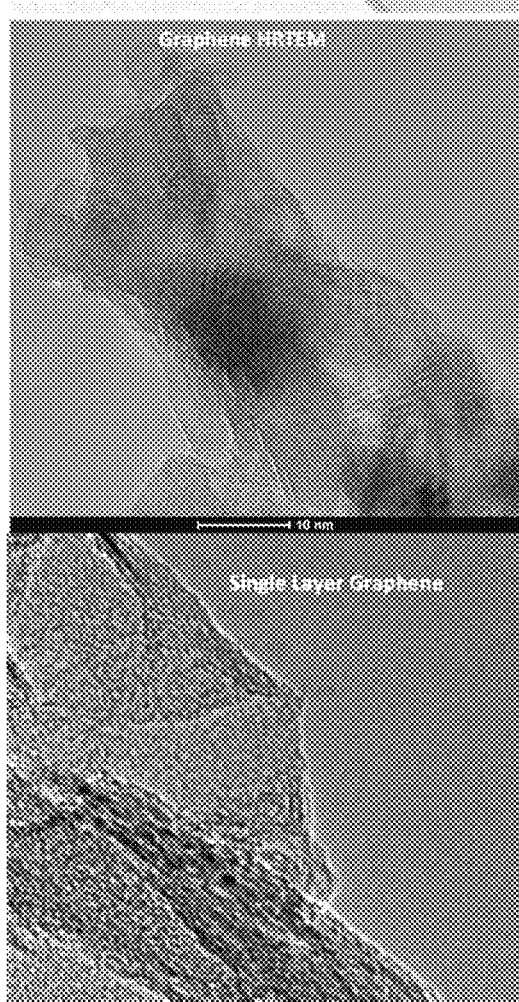
Figure 4B:
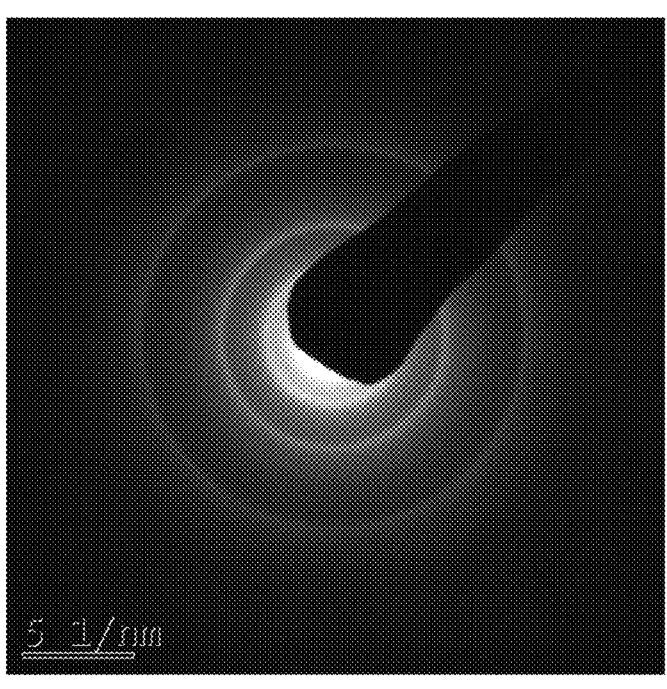

The submerged-plasma process is capable of high-rate production of GNFs. Production of high-quality GNFs by a shear-exfoliation process is demonstrated herein. FIG. 4 shows transmission electron microscopy (TEM) images of as-synthesized GNFs, all with high aspect ratios. It is believed that nucleation and growth of condensing-carbon species occurs on tiny steam bubbles developed at or near the plasma-reaction zone. FIG. 5A and FIG. B show the corresponding Raman spectra, which demonstrates that the GNFs are uniform in structure and have highly-defective nanostructures. Highly-defective nanostructures may prove to be advantageous in certain circumstances.

The opportunities abound for utilizing a submerged plasma plume in a variety of liquids, in order to attach the components of the liquid to the many available bonding sites of defective GNF materials. It may be possible, for example, to covalently bond GNFs to various oils, paints, and many other covalently bondable materials, to produce a wide variety of new and useful compounds.

Example 3

A current investigation pursues the use of a conventional tungsten-arc plasma torch, operating in the submerged mode, to fabricate kilogram quantities of nanostructured particles and films. A liquid precursor partially fills an inner-container that is supported on a rotating platform and water cooled. An outer container allows circulation of $N_2$ gas through the system to prevent hydrolysis of the liquid precursor. Loosely-agglomerated amorphous nanoparticles are formed within the liquid precursor, whereas relatively-dense amorphous films are formed on the cover plate of the reactor vessel not in contact with the liquid precursor. Relatively large-area flakes of aggregated nanoparticles are formed on the side walls of the reactor vessel, near the surface of the liquid precursor.

What is claimed:

1. A method for producing a nanostructured material comprising:
   (a) producing a zone of plasma;
   (b) submerging at least a portion of the jet of plasma in a quenching liquid;
   (c) contacting the submerged jet of plasma with a precur-sor material to form a nanostructured material;
   (d) injecting a precursor material into the plasma jet upstream of the quenching liquid; and
   (e) using the fabricated materials as synthesized or post annealing to modify the phase or microstructure or morphology.

2. The method of claim 1, wherein the zone of plasma in step (a) is produced by a high-enthalpy arc-plasma setup or tungsten-arc plasma.

3. The method of claim 1, wherein the zone of plasma in step (a) is produced by an inductively-coupled plasma setup.

4. The method of claim 1, wherein the zone of high enthalpy in step (a) is produced by a flame that is electro-magnetically or plasma assisted.

5. The method of claim 1, wherein the quenching liquid comprises the precursor material.

6. The method of claim 1, wherein the quenching liquid comprises high purity water or other solvent.

7. The method of claim 1, wherein a portion of the precursor material remains unsubmerged.

8. The method of claim 1, wherein the precursor material comprises a hydrocarbon, including methane.

9. The method of claim 1, wherein the precursor material comprises a solid in the submerged liquid.

10. The method of claim 1, wherein the precursor material comprises a liquid immediately prior to contacting plasma or contacting the plasma.

11. The method of claim 1, wherein the precursor material comprises a gas immediately prior to contacting plasma or contacting the plasma.

12. The method of claim 1, wherein the nanostructured material comprises a particle.

13. The method of claim 1, wherein the nanostructured material comprises a film.

14. The method of claim 1, wherein the nanostructured material comprises graphene nanoflakes or 2-D nanoflakes comprising h-BN or $MoS_2$.

15. The method of claim 1, wherein the nanostructured material is amorphous.

16. The method of claim 15, further comprising (f) annealing the amorphous nanostructured material to form an at least partially nanocrystalline material.

17. The method of claim 1, wherein the nanostructured material is produced at a rate of greater than or on the order of about 1 pound/hour (~0.45 kg/h).

\*    \*    \*    \*    \*